(12) United States Patent
Ebefors et al.

(10) Patent No.: US 8,598,676 B2
(45) Date of Patent: Dec. 3, 2013

(54) BARRIER STRUCTURE

(75) Inventors: Thorbjörn Ebefors, Huddinge (SE); Tomas Bauer, Bro (SE)

(73) Assignee: Silex Microsystems AB, Jarfalla (SE)

( * ) Notice: Subject to any disclaimer, the term of this patent is extended or adjusted under 35 U.S.C. 154(b) by 0 days.

(21) Appl. No.: 13/566,081

(22) Filed: Aug. 3, 2012

(65) Prior Publication Data

US 2012/0292736 A1    Nov. 22, 2012

Related U.S. Application Data

(62) Division of application No. 12/523,786, filed as application No. PCT/SE2008/050092 on Jan. 25, 2005, now abandoned.

(30) Foreign Application Priority Data

Jan. 25, 2007 (SE) ...................................... 0700172

(51) Int. Cl.
*H01L 29/06*  (2006.01)
(52) U.S. Cl.
USPC ......................................... 257/506; 257/510
(58) Field of Classification Search
USPC .................. 257/506–527, 620, E21.545
See application file for complete search history.

(56) References Cited

U.S. PATENT DOCUMENTS

| 5,064,771 | A | 11/1991 | Solomon |
| 5,767,561 | A | 6/1998 | Frei et al. |
| 6,303,462 | B1 | 10/2001 | Gidon |
| 7,052,939 | B2 | 5/2006 | Huang et al. |
| 7,365,382 | B2 | 4/2008 | Willer et al. |
| 7,687,332 | B2 | 3/2010 | Pizzarulli |
| 7,911,023 | B2 | 3/2011 | Akagi et al. |
| 8,421,183 | B2 * | 4/2013 | Ding et al. ............. 257/508 |
| 2002/0031897 | A1 | 3/2002 | Ueda et al. |
| 2003/0107061 | A1 | 6/2003 | Ootera |
| 2003/0153125 | A1 | 8/2003 | Ueda et al. |
| 2009/0039457 | A1 | 2/2009 | Xie |

FOREIGN PATENT DOCUMENTS

JP    2006332478    12/2006

OTHER PUBLICATIONS

International search report dated Jun. 17, 2008 in corresponding PCT/SE2008/050092.
E. Calleja et al., "Solid-State Electronics", Elsevier, vol. 39, issue 4, Apr. 1996, pp. 511-516.
Terence Gan, "Modeling of Chemical Mechanical Polishing for Shallow Trench Isolation", Massachusetts Institute of Technology, May 8, 2000.

* cited by examiner

*Primary Examiner* — Cuong Q Nguyen
(74) *Attorney, Agent, or Firm* — Young & Thompson

(57) ABSTRACT

A starting substrate in the form of a semiconductor wafer (1) has a first side and a second side, the sides being plane-parallel with respect to each other, and has a thickness rendering it suitable for processing without significant risk of being damaged, for the fabrication of combined analogue and digital designs, the wafer including at least two partitions (A1, A2; DIGITAL, ANALOGUE) electrically insulated from each other by insulating material (2; 38; 81; L) extending entirely through the wafer. A method for making such substrates including etching trenches in a wafer, and filling trenches with insulating material is also described.

7 Claims, 9 Drawing Sheets

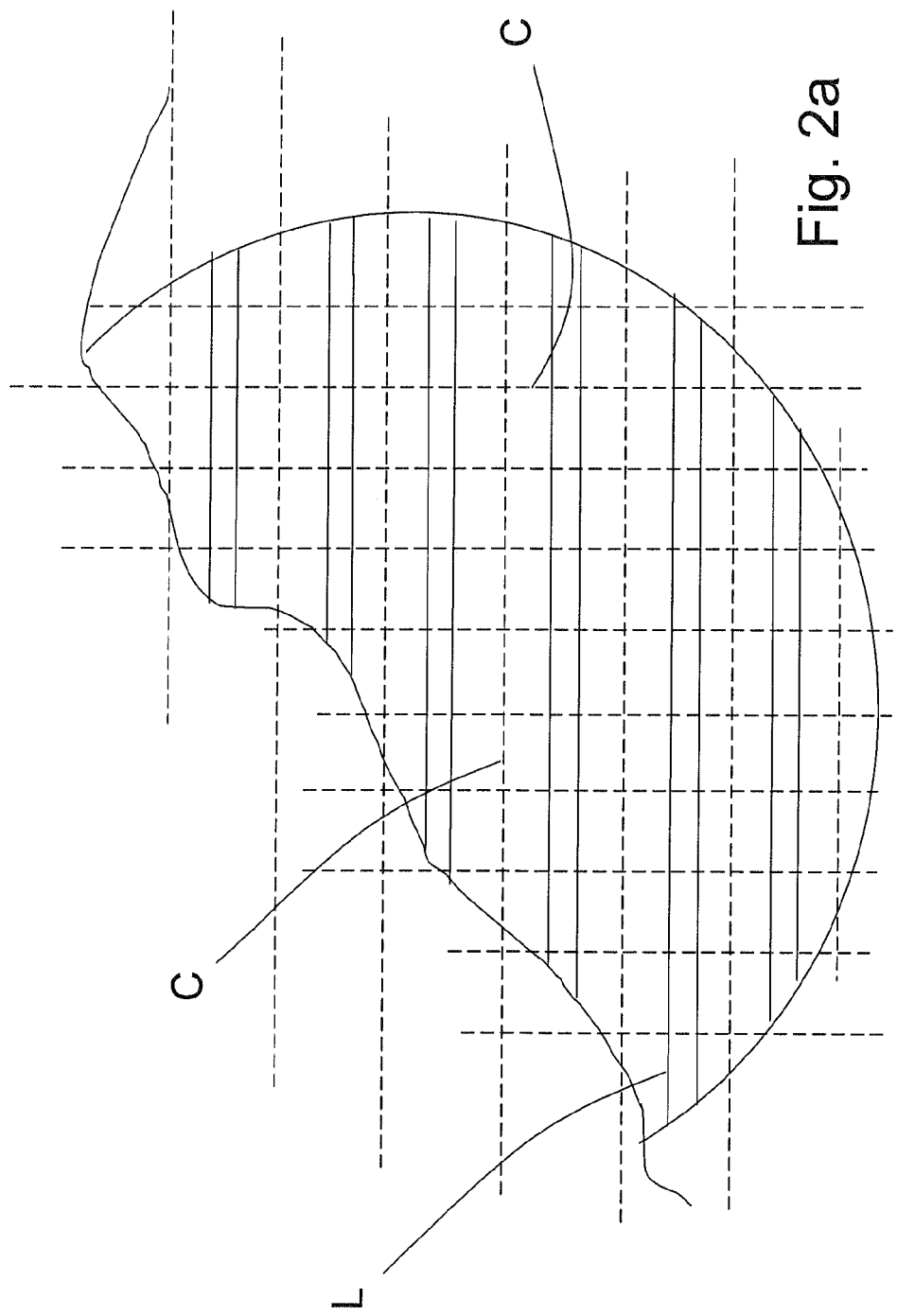

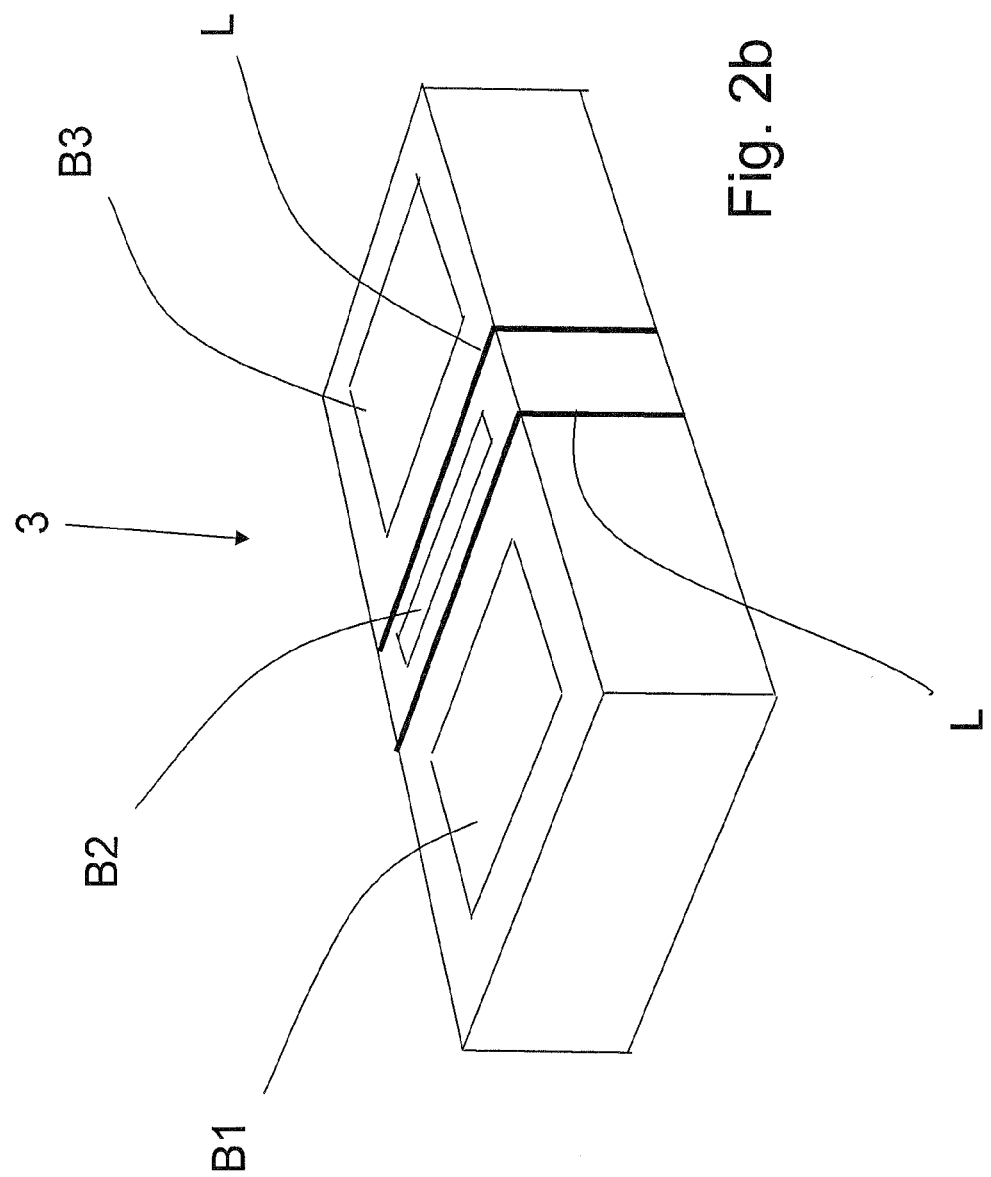

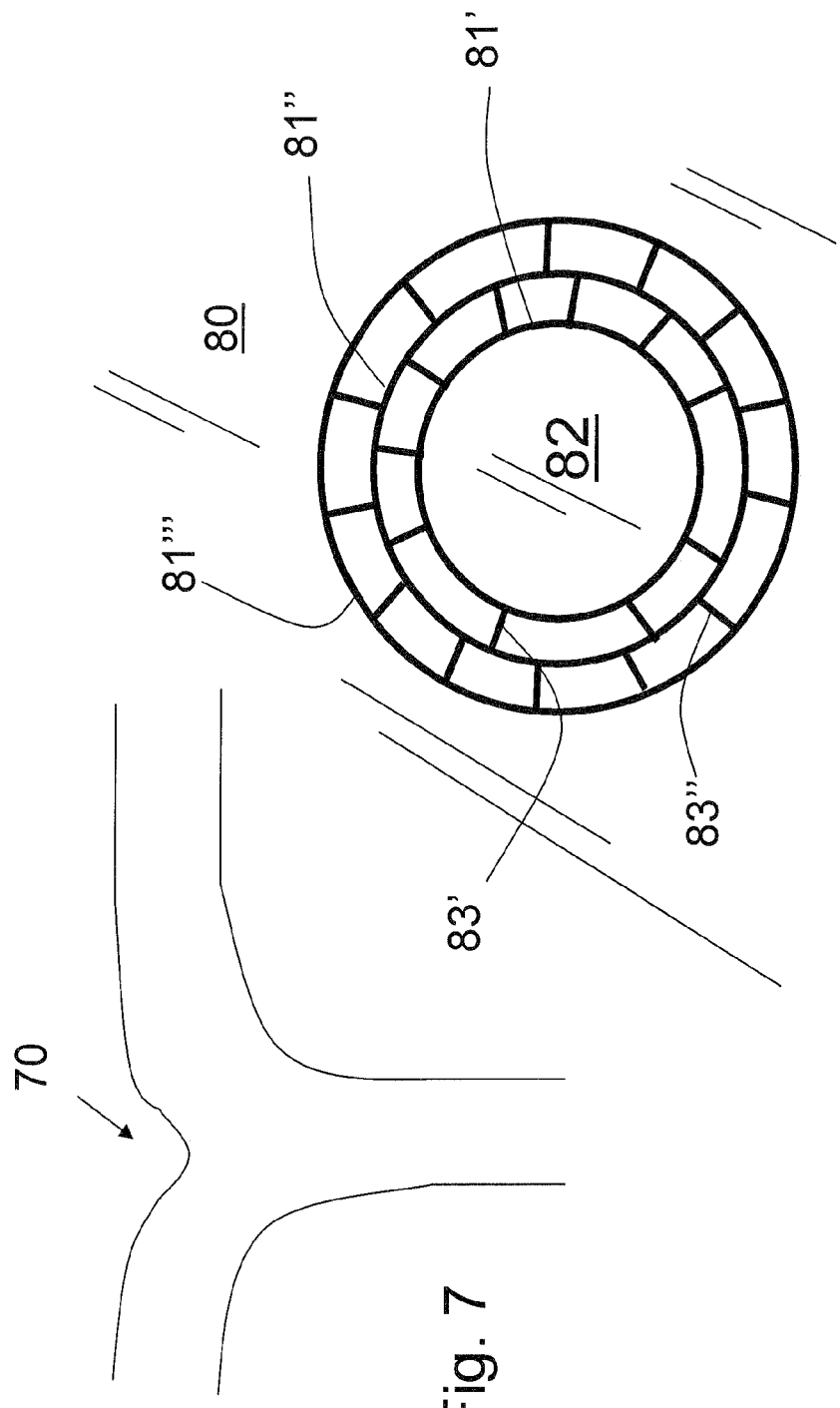

BARRIER STRUCTURE

CROSS REFERENCE TO RELATED APPLICATIONS

This application is a division of copending application Ser. No. 12/523,786 filed on Jul. 20, 2009; which is the 35 U.S.C. 371 national stage of International application PCT/SE08/50092 filed on Jan. 25, 2008; which claims priority to Swedish application 0700172-0 filed on Jan. 25, 2007. The entire contents of each of the above-identified applications are hereby incorporated by reference.

FIELD OF THE INVENTION

The present invention relates to design of micro electronic devices where e.g. both analogue and digital units are to be located in close proximity on substrates such as micro chips. In particular it relates to means and methods for eliminating or at least reducing so called cross-talk between analogue/digital components on the same substrate.

BACKGROUND OF THE INVENTION

When analogue and digital components are located on the same substrate in close proximity, such as is the case for ASIC devices, inevitably there will occur so called cross-talk between these components.

Capactive crosstalk can e.g. occur when digital signals are run near analog signals, the capacitance between the lines can cause the lines to couple and the signals become blurred due to coupling through the substrate underneath.

This problem can be eliminated by running the analog signals in a separate routing area than the digital, and by putting grounding shields between the analog and the digital.

The digital return currents return ground through a non-zero impedance, due to either resistive or inductive effects, which can cause the local "ground" to move up and down with the current. If this ground differs from the originator of the signal, this will cause voltage differences at the rate of the bits. This problem can be eliminated by improving grounding, or by understanding and controlling the paths that ground current flows in.

Some of the major problems induced by digital to analog and analog to analog cross talk are (1) high speed digital clocks cause severe interference with RF or IF front ends; (2) in digital portables, time-division-multiple-access (TDMA) may be used and power on/off cycles happen fairly frequently, causing additional transient noise on the power and ground planes; (3) in frequency division duplex systems, as well as in pixel based imaging devices, high-power transmit signals cause interference with weak receive signals since separation by filters is limited; (4) the leakage of the amplifier output to the input may cause the amplifier to oscillate.

A critical requirement for the development of low cost, wide-bandwidth telecommunications equipment is the close integration of both digital and analog microelectronic components. The physical interface between an IC and its environment is the IC package, and its performance is severely tested by the high speed and high frequencies encountered in wide-bandwidth systems. Single chip mixed signal ICs that combine directly both high frequency analog and high speed digital sub-sections will require proper electromagnetic understanding of capacitive, inductive, and radiative coupling between components, and their impact on high sensitivity analog sub-circuits.

Crosstalk and interference between devices in mixed signal ICs can be reduced when SOI wafers are used due to the isolation of devices from the substrate.

In the prior art where the cross talk problems have been addressed, several alternative solutions have been presented.

One way of dealing with it is so called counter junction doping, which entails reverse biased layers to prevent cross talk through the common substrate on which components are provided in combination with large physical separation between analogue and digital parts. The latter is of course limiting on the possibilities to reduce component size, which is disadvantageous.

Another approach is to use SOI substrates to bring about dielectric isolation/insulation across the substrate.

A still further prior art solution is to combine use of SOI and non-wafer through trenches. The usage of such trenches are well known in IC industry but then the normal approach is to make the trenches as a last step in the processing. Starting substrates (trench first approach) with filled isolated trenches through a device layer on an SOI wafer with limited trench depth are commercially available from for example IceMOS (Northern Ireland, United Kingdom; www.icemostech.com). The general problem with this type of solution is that trenches must be narrow enough to be able to be filled. The DeepReactive Ion Etching (DRIE) method often referred to as the Bosch process used to etch the trenches gives a practical maximum aspect ratio of about 1:40. The prior art methods which use typically 3 µm wide trenches that are fairly simple to fill limits the depth to which the trenches penetrate to approximately 100-150 µm. Such thin wafers are not possible to use as starting substrate. Hence a SOI wafer with a thick handle wafer is used to obtain robust enough substrates to allow further processing. The trenches are then made in a 100-150 thick device layer. The fabrication costs of an SOI wafer compared to conventional non-SOI substrates is approx 10 times higher. For several low cost devices with mixed analogue/digital or high frequency designs such as Bluetooth chips and alike that should gain improved performance with wafer through isolated trenches according to present invention, the extra cost of using trench filled SOI wafers as starting substrates is prohibitive.

It would be desirable 300 um

In WO 2004/084300 (Silex Microsystems) there is disclosed a method of making electrical through connections involving etching deep trenches, the contents of which is incorporated herein in its entirety.

SUMMARY OF THE INVENTION

In view of the drawbacks with prior art methods and devices the present invention sets out to provide starting substrates for mixed analogue/digital designs, wherein the cross talk between components of such designs is eliminated or at least substantially reduced.

In a first aspect the invention provides a starting substrate for mixed analogue/digital designs, comprising isolated substrate parts wherein the isolated parts are separated by insulating trench structures, as defined in claim 1.

In a second aspect there is provided a method for making such a starting substrate.

In a still further aspect there is provided an interposer substrate for e.g. wafer level flip-chip mounting of mixed analogue/digital devices such as ASICs.

Further scope of applicability of the present invention will become apparent from the detailed description given hereinafter and the accompanying drawings which are given by way of illustration only, and thus not to be considered limiting on the present invention, and wherein FIG. 1 is a schematic illustration of the inventive concept;

FIG. 2a schematically shows cutting pattern for obtaining a chip shown in FIG. 2b;

FIG. 2b illustrates a single chip;

FIG. 3 schematically illustrates a mounted multi-chip component implementing the invention;

FIG. 4 is a cross-section at B-B in FIG. 3;

FIG. 5 schematically illustrates an array of imaging devices interconnected with ASICs and/or other electronic components, using the invention;

FIG. 7 shows etch load compensation at corners;

FIG. 8 shows a via/trench structure with redundancy; and

Figure 9:
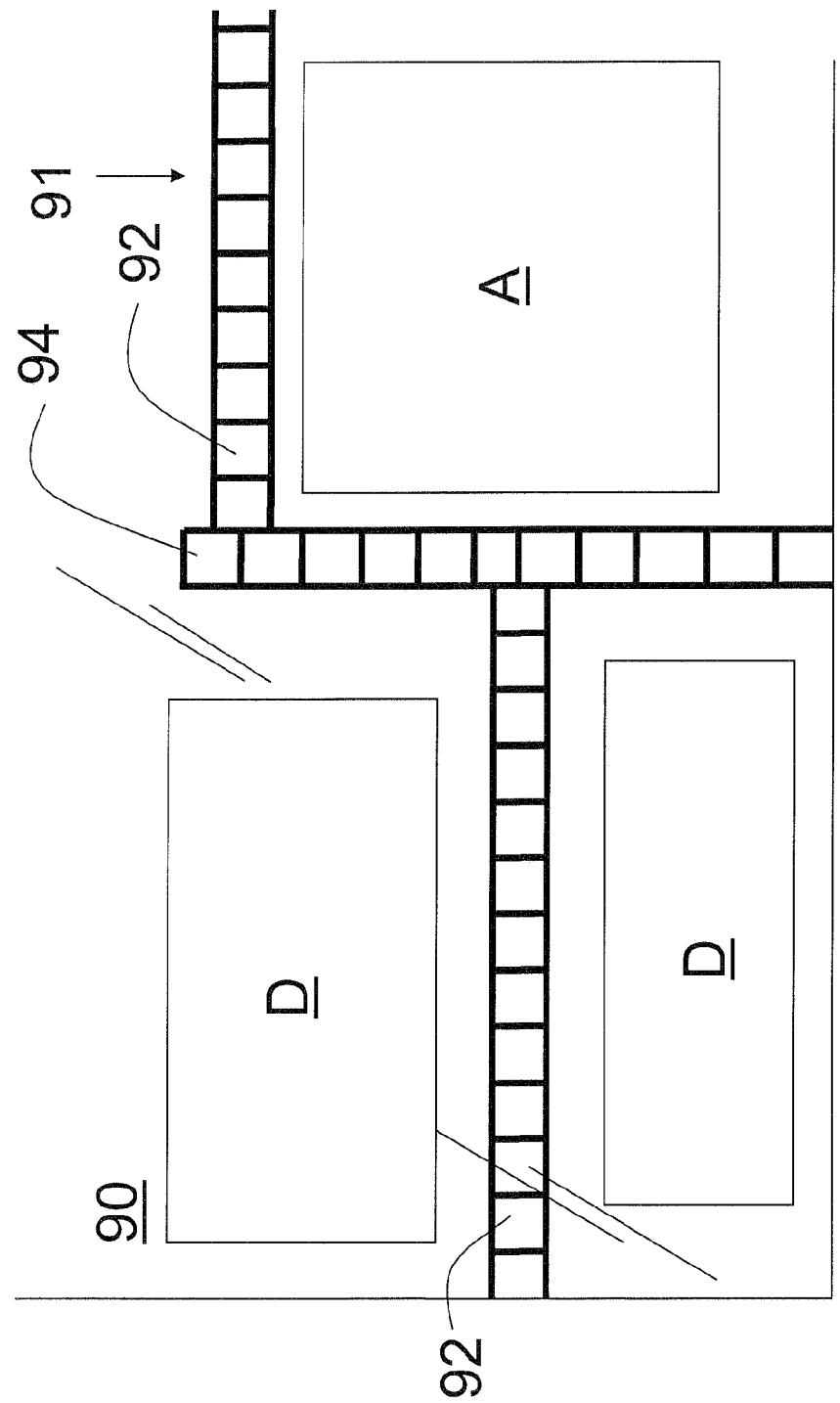

FIG. 9 schematically shows an implementation of the invention.

DETAILED DESCRIPTION OF PREFERRED EMBODIMENTS

In the following description specific terms and expression will be given the following meanings:

Capactive crosstalk: when digital signals are run near analog signals, the capacitance between the lines can cause the lines to couple and the signals become blurred due to coupling through the substrate underneath. This problem can be eliminated by running the analog signals in a separate routing area than the digital, and by putting grounding shields between the analog and the digital.

The invention will now be further illustrated by embodiments thereof with reference to the drawings.

Figure 1:
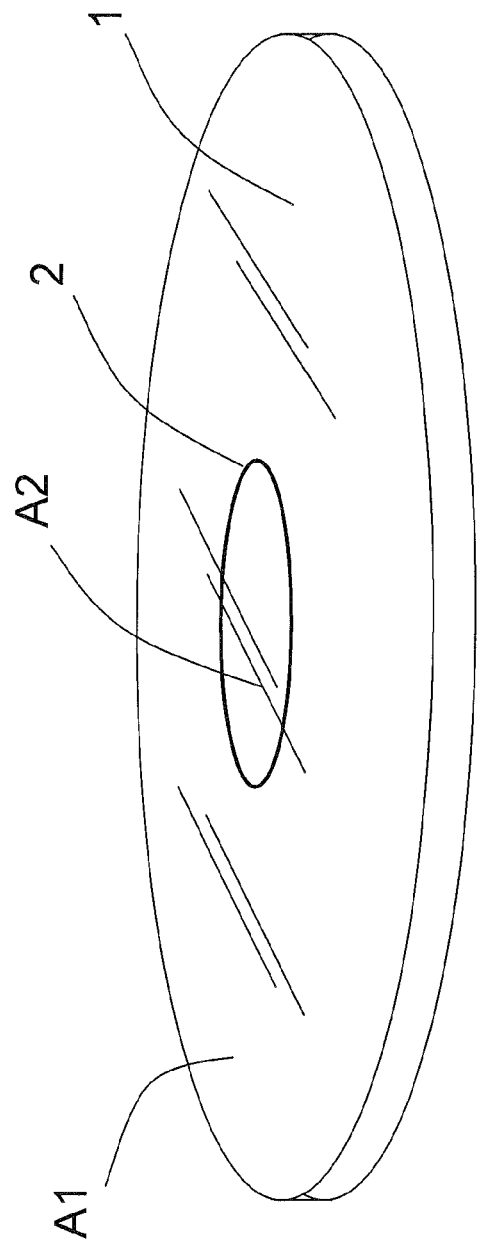

In its simplest embodiment the invention can be represented by the structure shown in FIG. 1. It comprises a wafer 1 of e.g. silicon, although a number of other semi-conductor materials are possible. The wafer has two areas A1 and A2, respectively, separated from each other by a barrier of insulating material 2 extending through the wafer and enclosing one area A2. The wafer should be thicker than about 300 μm in order to provide enough rigidity to enable handling of the wafer during processing without risk of breaking it. Preferably the thickness is >400 μm, most preferred >500 μm. This substrate could be used for making a device wherein there is provided electronics generating RF signals in partition A2, and digital electronics in partition A1, essentially without any interfering cross-talk between the partitions occurring.

For micro-electronic applications wherein a wafer can be used for making large numbers of small chips by suitable processing and subsequent cutting of the wafer into discrete small chips, other patterns of insulating barriers are used.

The barriers can be made using the method for etching deep trenches disclosed in the above mentioned WO 2004/084300.

FIG. 2a illustrates a part of a wafer 1 having such barriers L laid out in lines extending across the wafer. Cutting of the wafer along the broken lines C after suitable processing to provide some electronic structure thereon (not shown) would yield individual chips 3 with a lay-out of insulating barriers L as shown in FIG. 2b, wherein the three separated areas B1, B2, B3 are insulated form each other and will efficiently prevent cross-talk between the areas. B1 could e.g. be used for RF electronics, B2 for digital logics and B3 for analogue electronics.

These two above illustrated embodiments are extremely simple examples.

Figure 3:
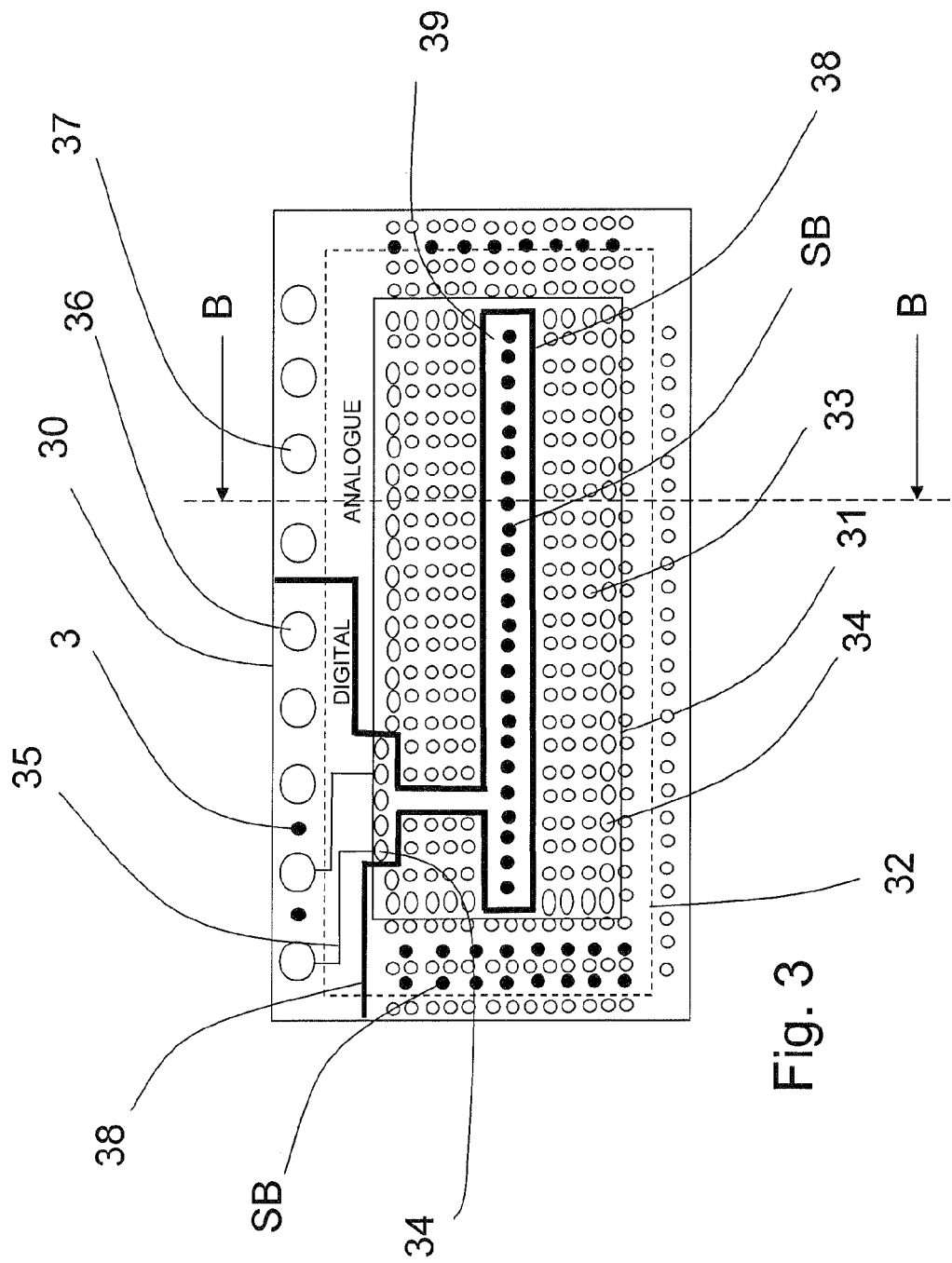

In FIG. 3 an interposer with mounted chips is schematically illustrated in a top view, wherein the invention has been implemented in the interposer chip 30 on which a mixed analouge-digital ASIC 31 has been mounted. The ASIC is only shown schematically with a contour line. Of course it is to be understood that any type of electronic component can be used, although below reference is made to ASICs.

On the opposite side of the interposer an input device, such as a pixel based image device 32, e.g. a camera chip, has been mounted. This device is shown schematically with a broken contour line. Also shown in the figure there are indicated solder bumps SB provided on the image device 32. These solder bumps are each associated with an output pad related to a pixel element on the image device 32 (not shown in FIG. 3). Most of the output pads are uniformly distributed in a large array configuration. The pixel elements are connected via the solder bumps and routing structures 35 to one via each (not shown), to couple the signal through the interposer such that the image device 32 and the ASIC 31 can be connected as described more in detail below.

The interposer 30 comprises a plurality of electrical through connections (vias), indicated with reference numeral 33. In the shown embodiment the vias are distributed over the entire surface of the interposer 30, except in the digital "island" 39. These vias are used for coupling signals to and from the ASIC 31 and the image device 32 through the wafer. The metal routing on both sides of interposer 30 means that the position of output pads on imaging device 32 must not necessarily match those on the ASIC 31 (this is referred to as redistribution with "fan in/fan out" of routings).

Connections between the vias 33 and the ASIC 31 is via contact bumps 34 on bottom surface of the ASIC and routing structures 35 suitably in the form of narrow metallizations on the interposer 30. The bumps 34 are shown to be elliptical only for the purpose of distinguishing them from the vias in the figure. Only a few of the routings 35 have been indicated for clarity.

In the part of the interposer labelled DIGITAL and 39 (separated from the part labelled ANALOGUE by means of the barriers 38, see further below) there are arranged a plurality of "I/O" bumps 36. These bumps are connected to external control devices (not shown) for digital control of the ASIC 31. Routing metallizations 35 connect the bumps 36 to the contact bumps 34 on the ASIC 31.

In the other part of the interposer labelled ANALOGUE there are also a plurality of "I/O" bumps 37 for analogue signals for connecting the ASIC 31 to external devices.

In operation the digital signals have a high frequency and are represented by voltage pulses with a very steep rising flank, and will very easily couple into the analogue parts of the device ("cross-talk"), through the substrate, if there are no effective barriers against such cross-talk.

To this end, the interposer 30 also comprises a barrier 38 of insulating material extending all the way through the wafer and laid out in a pattern so as to separate two partitions on the wafer. Suitably the barriers are 3-30 μm wide (in the plane of the wafer). In preferred embodiments the barriers are 5-15 μm wide, and a common width is about 8 μm. This barrier effectively shields the enclosed area ("digital ground") 39 from cross-talk between components in two different areas. Thus, the analogue I/O part ANALOGUE is effectively shielded against interfering signals from the digital I/O part DIGITAL, and the digital routing on the ASIC into the digital area on the ASIC overlaying with the digital isolated island 39 on the interposer.

Multiple interposer chips are created on wafer level, and on each interposer, an ASIC has been mounted by wafer level assembly using e.g. pick and-place flip-chip soldering before cutting.

Figure 4:
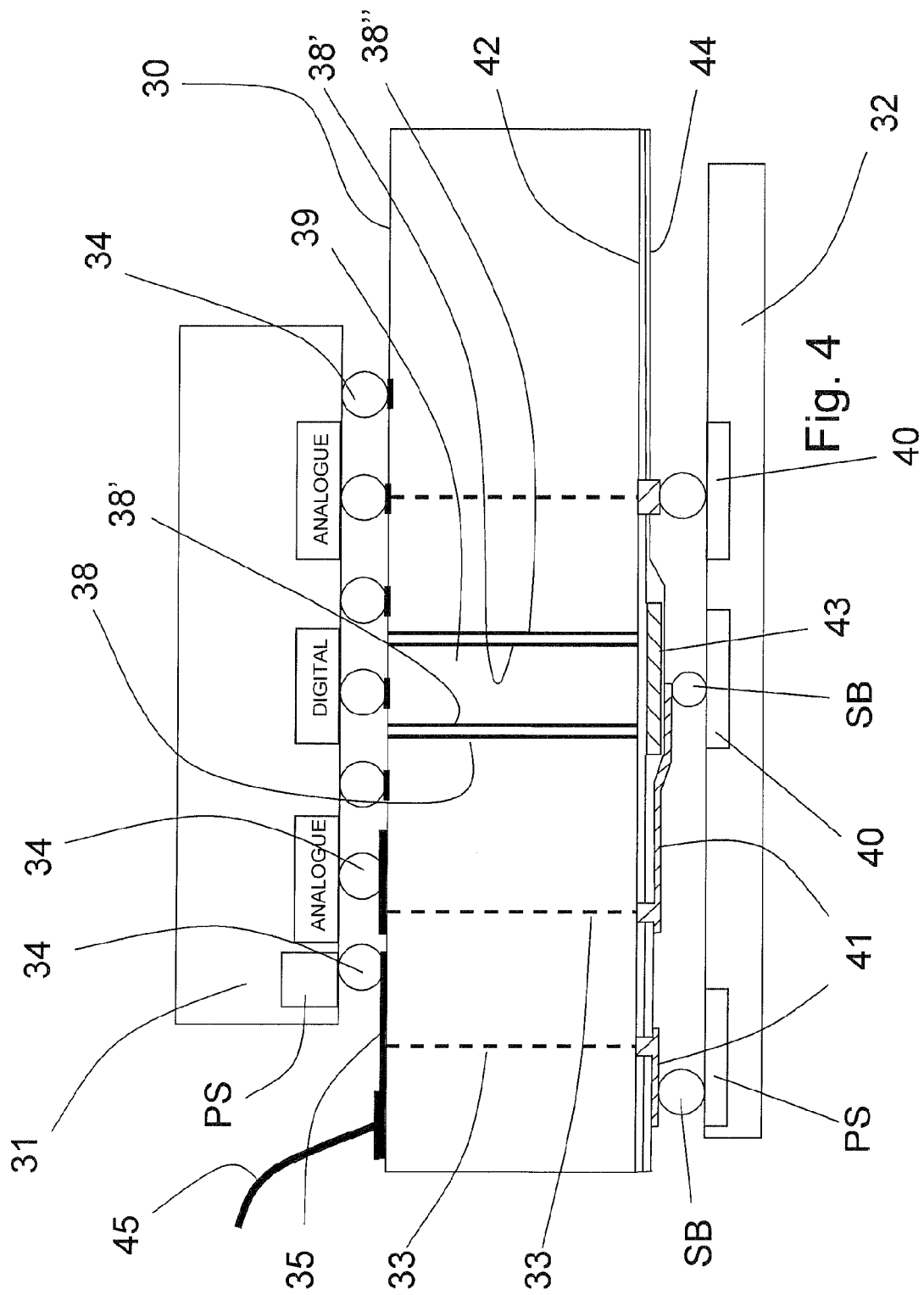

In order to clarify the structure and to illustrate the invention in more detail FIG. 4 shows a cross-section through A-A in FIG. 3. The same reference numerals as in FIG. 3 will be used for like elements. It should be noted that only details of the structure are shown for clarity. Also, the figure is not to scale. Thus, there are numerous via structures in a device like this only three of which are shown. Also, there is a plurality of solder bumps on the image device, only three of which are shown.

The interposer 30 made from a silicon wafer comprises a plurality of electrical through connections ("vias") 33, only three of which are shown with broken lines. Such vias can be made by a method disclosed in applicants own WO 04/084300 mentioned earlier. These vias are used to interconnect the ASIC 31 and the image device 32.

The vias are made according to WO 04/084300 in a process comprising two general steps, namely provision of trenches and introducing insulating material into the grooves, and optionally filling the trenches, at least partially with oxide.

The starting material is a conducting or a semiconductor wafer, suitably a silicon wafer (although there are no specific limitations on the materials used), having a thickness of 500 μm, although the thickness can vary between 300 μm and 1000 μm. Most commercially available silicon (or other semiconductor) wafers are about 300-1000 μm thick, depending on size and intended application. However, the invention is applicable to wafers exhibiting a thickness of 200-5000 μm, preferably 300-3000 μm, most preferably 400-1000 μm.

The first general step is the provision of a trench, i.e. a narrow recess encircling a portion of the wafer top surface. The trench is made for example by etching or by laser based machining, or by EDM (electro-discharge machining).

Trench definition is achieved by providing a lithographic mask on the wafer. Preferably trenches are made by any etching method yielding a high aspect ratio, e.g. DRIE (Dry Reactive Ion Etching), electrochemical HF etch.

The trench should be less than 20 μm, preferably 4-15 μm, most suitably about 6-12 μm wide. Thus, the layers of insulating material are 1-20 μm, typically 6-12 μm thick.

The insulating material should have certain electrical properties, such as a break down voltage of 1 kV or more; and a dielectric coefficient of 4-9.

Furthermore, the insulating material suitably extends over the substrate in a pattern adapted to a design of a selected electronic device.

The imaging device can be e.g. a photonic (X-ray, IR, visible etc) detection device, or a mirror array for light projection or a fingerprint detection device, and comprises a plurality of pixel elements 40, only two of which are shown in FIG. 4 for clarity. Each pixel 40 is provided with a solder bump SB and connected to a respective via 33 by routing structures 41 in the form of narrow metallizations.

The ASIC 31 comprises analogue and digital components provided in separated parts. These components are contacted with the vias 33 via solder bumps 34. In order to avoid the cross-talk discussed above, there are barriers 38 provided extending through the wafer. In FIG. 4 these barriers are shown in "pairs", i.e. two barriers 38', 38" run in parallel. This design is made for the purpose of creating redundancy against short-circuiting, a phenomenon that will be discussed more in detail below. The barriers 38', 38" enclose a shielded area 39 used for digital ground and will effectively shield the analogue and digital areas from cross-talk between each other through the substrate. In order to further shield the digital ground 39 there is an insulting layer 42 provided on the bottom surface of the interposer 30, and thereon is a shield layer 43 of metal provided covering the ground area 39. On top of the shield layer a further insulating layer 44 is provided, covering the bottom surface of the interposer 30.

For connection to external equipment there is provided wire bonding 45. This is used for supplying power to both sides of the interposer. The wire 45 is bonded to a pad and routed using metallization 35 to a via 33. In the imaging device there is a power supply PS that picks up power from the via and a solder bump SB. Similarly, a power supply PS in the ASIC 31 on the opposite side is connected via a solder bump 34 on the interposer, using the same routing 35.

Figure 5:
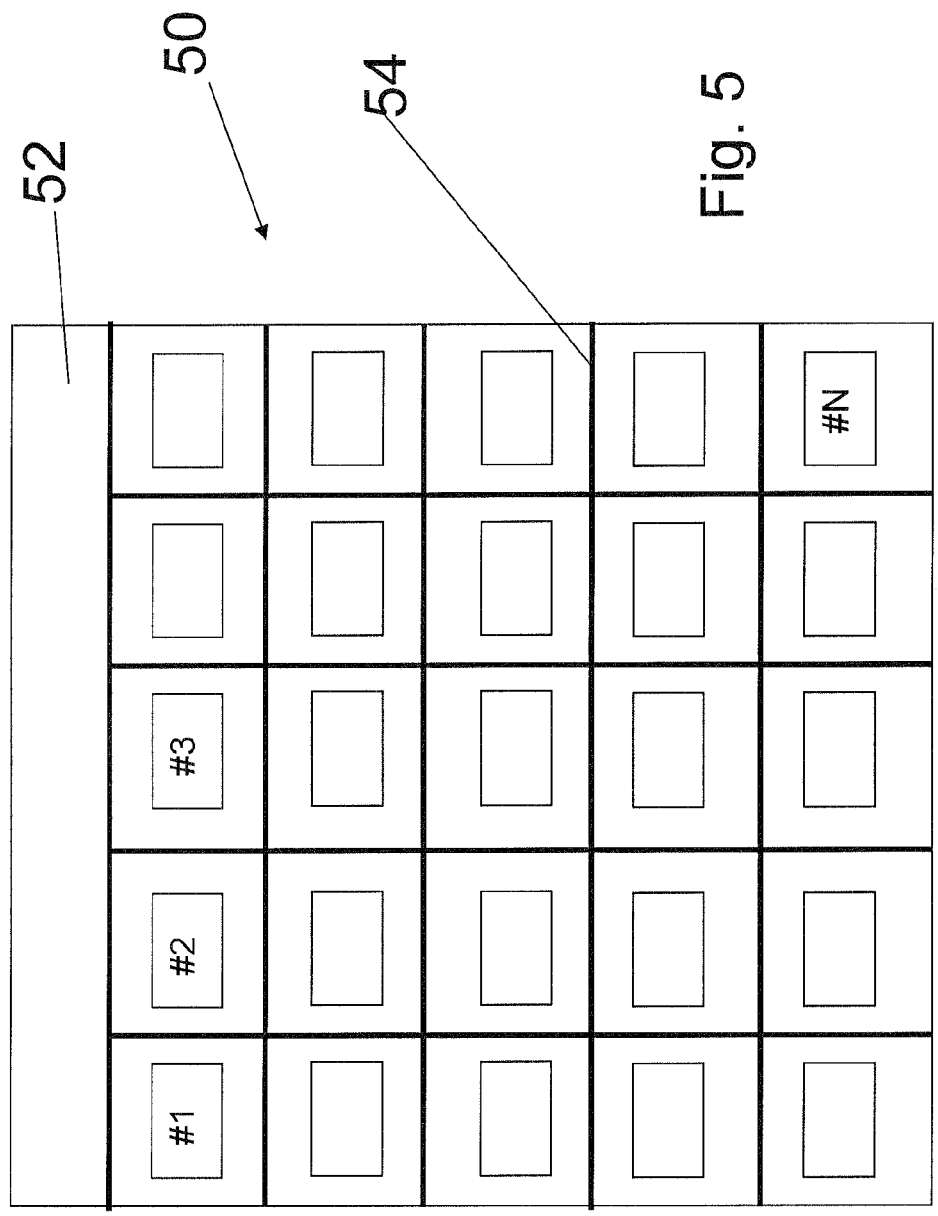

In FIG. 5 there is shown a further application of the same principle as used in FIG. 4. Here the single mixed analogue/digital component is replaced by a plurality of separate analogue and digital components. It illustrates an array of imaging devices, such as a full 35 mm camera sensor, wherein the sensor array has been split up e.g. into smaller and less expensive chips. The chips are mounted on an interposer 50 similar to the one disclosed in FIGS. 3 and 4. The chips are connected to ASICs and/or other electronic components (#1, #2, #3, . . . "N) on the opposite side of the interposer using vias, as discussed above in connection with FIGS. 3 and 4. Such imaging devices can be used for detection of X-rays, IR light, visible light etc. with low signal levels. Each combination of imaging chip with ASIC (and other components) are separated by barriers 54 similar to the ones disclosed in FIGS. 3 and 4. By providing each ASIC on an insulated "island" on the interposer 50, cross-talk is essentially avoided, which otherwise could cause common ground to move up and down and cause self oscillation, especially if the ASICs contain analogue amplifiers with high amplification.

If the imaging device is a micromirror array, normally hundreds of volts are applied. The trench insulation should therefore withstand such high voltages, and a break-down voltage of at leas 1 kV is required. The isolated island should protect from capacitive cross-talk.

A problem that can occur with very long trenches, such as those forming the barriers 38 in FIGS. 3 and 4 used for preventing cross-talk, as discussed above, is that in view of the trenches in a standard situation being about only 8 μm wide, it will suffice if one single particle with conductive properties gets "caught" in the trench and forms a bridge between the via and the surrounding wafer material in order that the area enclosed by the trench will be short-circuited. The probability of this happening becomes increasingly larger as the length of the trench increases, and will inevitably cause high rejection rates and thus low manufacturing yields.

By making a trench structure introducing a redundancy, this problem can be ameliorated.

The way this is solved by the invention is as follows, reference being made to FIGS. 8 and 9.

As shown in FIG. 8, two or more trenches 81', 81", 81''' are made as concentric circles or squares or rectangles or any other geometric shape on a wafer 80, enclosing an area 82, and each circle is connected to the next by radially extending trenches 83', 83" wherein three concentric trenches are connected by the radial trenches.

This principle can be used for the purpose of the present invention, namely to isolate parts on a substrate wafer from each other, so as to eliminate or reduce cross talk between components on the substrate.

This is better illustrated in FIG. 9 which intends to show schematically a chip 90 on which there are provided both analogue A and digital D components, that would cause unwanted cross talk unless they are separated.

Between the components A, D there has been provided a trench structure 91 as described above. This will efficiently shield the wafer (substrate) portions from currents leaking between the dedicated analogue and digital portions, A and D, respectively respectively. To further improve redundancy and to lower the capacitance between Analogue and Digital areas, several parallel trench chains would suitably be provided.

Figure 6:
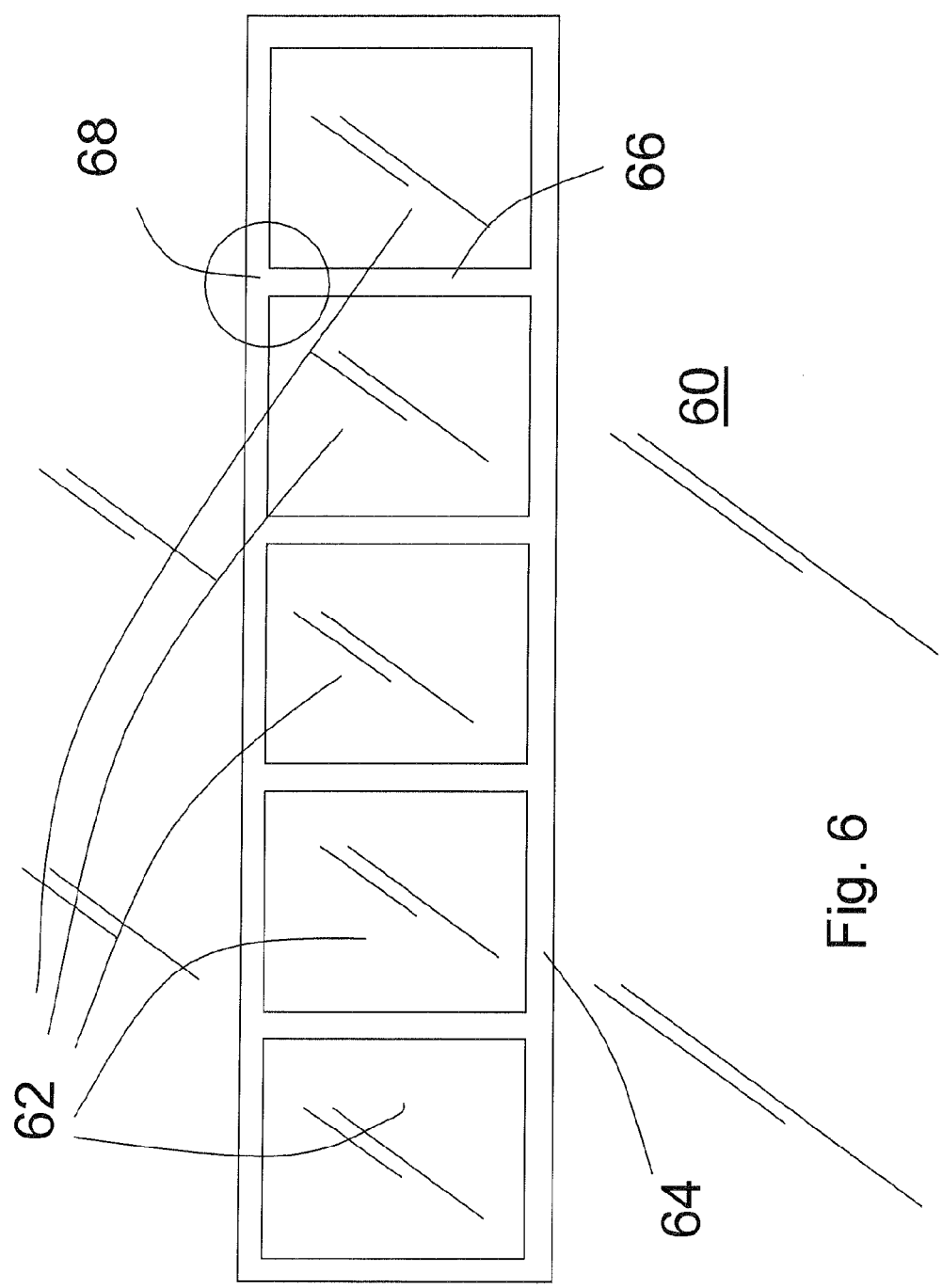
FIG. 6 illustrates an array of closed packed vias.

In order to enable the provision of barriers for efficiently preventing cross-talk as discussed above, the inventors have devised a method of making very closely spaced vias, and an example of such vias 62 is schematically shown in FIG. 6 as a top view of a portion of a wafer 60 having the novel trench structures provided therein (see also FIG. 9). The filled trenches are designated 64. The idea is to let neighbouring vias share a common insulated trench as at 66 in FIG. 1. A typical centre-to-centre distance for these vias is about 50 μm, if trenches are 10-15 μm wide and the side dimension of vias is, typically 35-40 μm. In FIG. 9 where the chain "ladder" shaped trenches 91 are used for redundancy, the "plugs" (vias) 92 between the trenches are made of wafer native material. In the case of silicon this entails high dielectric coefficient. By allowing a floating potential on these "plugs" 92, the capacitance between A and D is considerably decreased compared with the case if only one single trench should be provided.

However, in the process of making trenches comprising arrays of contiguous vias or plugs of this type, the problem of varying etch performance over the surface of a wafer is noticeable and will have an influence on the result. In order to make what is referred to as an "etch load compensation", in accordance with an aspect of the invention there will always be made a redundant via 94 at each end of the trench structure built up from the array.

However, there is a further problem associated with the manufacture of this kind of via arrays. This problem occurs in the corners where trenches meet, e.g. at 68 in FIG. 6. What happens is that the applied etch will act on the wafer material from two or more directions (depending on the number of trenches that meet), and the result is that the depth to which the etch will reach will vary and become deeper at the corners. The etch will therefore penetrate through the wafer or reach a stop layer at different times in different locations, which could be detrimental to the result.

In order to eliminate or at least reduce this problem to be insignificant, the corners are given a special geometry schematically shown in FIG. 7, which corresponds to the encircled part shown at 68 in FIG. 6. The optimal shape can be determined based on etching parameters used for each specific case. Narrowing the trenches like this, as shown at 70, will ideally result in trenches having essentially the same depth, or at least will the etch not be too deep in the corners of the trench structure.

The idea of introducing narrowing structures in the trench to obtain uniform etching behaviour is not limited to the "T" corner intersection shown in FIG. 7. It is generally applicable to "Y" and "X" multi trench interconnections. Different shapes of narrowing could be adopted and the invention is therefore not limited to the shape shown in FIG. 7.

It can also be noted in FIG. 9 that the "ladder" shaped trenches are connected with each other such that only "T" corners are present.

The invention claimed is:

1. A barrier structure for a semiconductor substrate for eliminating or reducing cross-talk between different partitions on the substrate, comprising:
    at least one barrier of insulating material extending entirely through the substrate, said at least one barrier comprising at least two insulating filled trenches extending through the substrate and running in parallel, and at least two cross-connecting insulating filled trenches extending between said at least two parallel trenches.

2. The barrier structure as claimed in claim 1, wherein said at least two parallel trenches run concentrically, and said at least two cross-connecting trenches extend radially between said at least two concentric trenches.

3. The barrier structure as claimed in claim 1, wherein trench portions where said parallel and cross-connecting trenches interconnect are narrower than other trench portions.

4. The barrier structure as claimed in claim 3, wherein the trench portions where said trenches interconnect are at least one of T-shaped and Y-shaped and X-shaped multi trench intersections.

5. The barrier structure as claimed in claim 1, wherein said at least two parallel trenches comprise at least three concentric geometric shapes enclosing an area where each of said concentric geometric shapes is connected to an adjacent one by said at least two cross-connecting trenches that extend radially.

6. The barrier structure as claimed in claim 1, comprising at least three of said parallel trenches.

7. An interposer for reducing cross-talk between electronic components, comprising:
    a semiconductor chip having at least two partitions electrically insulated from each other by barriers of insulating material extending entirely through the wafer,
    wherein the barriers comprise the barrier structure according to claim 1.

* * * * *